United States Patent
Ordentlich et al.

(10) Patent No.: US 8,938,575 B2
(45) Date of Patent: Jan. 20, 2015

(54) MINIMIZED HALF-SELECT CURRENT IN MULTI-STATE MEMORIES

(75) Inventors: Erik Ordentlich, San Jose, CA (US); Ron M Roth, Haifa (IL); Gadiel Seroussi, Cupertino, CA (US)

(73) Assignee: Hewlett-Packard Development Company, L. P., Houston, TX (US)

( * ) Notice: Subject to any disclaimer, the term of this patent is extended or adjusted under 35 U.S.C. 154(b) by 330 days.

(21) Appl. No.: 13/438,438

(22) Filed: Apr. 3, 2012

(65) Prior Publication Data

US 2013/0262759 A1   Oct. 3, 2013

(51) Int. Cl.
*G06F 12/00* (2006.01)

(52) U.S. Cl.
USPC ........... 711/103; 711/207; 365/158; 365/163; 365/189.16

(58) Field of Classification Search
USPC .............. 711/103, 207; 365/158, 163, 189.16
See application file for complete search history.

(56) References Cited

U.S. PATENT DOCUMENTS

| | | | |
|---|---|---|---|
| 6,857,054 B2 * | 2/2005 | Minne | 711/163 |
| 7,821,843 B2 | 10/2010 | Houston | |
| 7,859,884 B2 | 12/2010 | Scheuerlein | |
| 7,885,094 B2 | 2/2011 | Min et al. | |
| 8,000,161 B2 | 8/2011 | Stan et al. | |
| 2004/0003191 A1 * | 1/2004 | Minne | 711/163 |
| 2010/0034015 A1 | 2/2010 | Tsuji | |
| 2013/0097396 A1 * | 4/2013 | Ordentlich et al. | 711/154 |
| 2013/0100727 A1 * | 4/2013 | Ordentlich et al. | 365/148 |
| 2013/0103888 A1 * | 4/2013 | Ordentlich et al. | 711/103 |

FOREIGN PATENT DOCUMENTS

JP   2010157297   7/2010

* cited by examiner

*Primary Examiner* — Reginald Bragdon
*Assistant Examiner* — Mehdi Namazi
(74) *Attorney, Agent, or Firm* — Hewlett-Packard Patent Department

(57) ABSTRACT

A multi-state memory system with encoding that minimizes half-select currents. The system includes an array of row and column conductors with a plurality of storage cells each capable of being placed into any of three or more physical states. An encoder is connected to receive data bits for storage and to apply activation signals to the row and column conductors to write information to the storage cells. The encoder is programmed to encode the data bits into entries in an array having one row corresponding with each row conductor and one column corresponding with each column conductor; select entries in the array according to half-select currents of the storage cells; apply a predetermined one-dimensional mapping that increases the value of at most one entry in the array to obtain a mapped array; and write entries of the mapped array into the storage cells.

14 Claims, 11 Drawing Sheets

MINIMIZED HALF-SELECT CURRENT IN MULTI-STATE MEMORIES

BACKGROUND

Binary data storage cells can be in either of two states. Typically these states are characterized as "0" and "1", "off" and "on", "lo" and "hi", or the like. Such storage cells may be fabricated in a cross-bar structure or other two-dimensional array of conductors where each cell is connected between a row conductor and a column conductor. In such an array, a given storage cell may be accessed by selecting the appropriate row and column conductors, for example by applying a voltage across the row conductor and the column conductor between which that given cell is connected. If the desired operation is to "write" a 0 or a 1 to the cell, the voltage is set to a value that will cause the cell to assume the desired state. If the desired operation is to "read" from the cell, the voltage is set to a value that will result in a flow of current through the cell, the magnitude of the current flow indicating the state of the cell.

Storage cells that can be in any of s different states, where s is an integer greater than two, are now being realized. Such storage cells, of which memristors and chalcogenide phase change memory (PCM) cells are examples, offer the prospect of greatly reducing the cost and space required for storing a given amount of data. These multi-state storage cells may be fabricated in cross-bar structures or otherwise connected in two-dimensional arrays and accessed in a similar way as binary storage cells.

Binary data can be encoded for storage in multi-state storage cells. For example, if a certain storage cell can assume any of four states, two binary bits can be encoded for storage in that cell by concatenating them to form a symbol. The symbol in turn can be expressed as any of the four states that can be stored in the four-state storage cell. The states correspond to values of a physical characteristic such as resistance. For example:

| $1^{st}$ bit | $2^{nd}$ bit | Symbol | State | Resistance |
|---|---|---|---|---|
| 0 | 0 | 00 | 0 | 19,000 ohms |
| 0 | 1 | 01 | 1 | 16,000 ohms |
| 1 | 0 | 10 | 2 | 13,500 ohms |
| 1 | 1 | 11 | 3 | 12,000 ohms |

When the state of the storage cell is read, that state is decoded by expressing it as a two-bit symbol, and from the symbol the individual bits are recovered.

BRIEF DESCRIPTION OF THE DRAWINGS

The figures are not drawn to scale. They illustrate the disclosure by examples.

DETAILED DESCRIPTION

Figure 1:
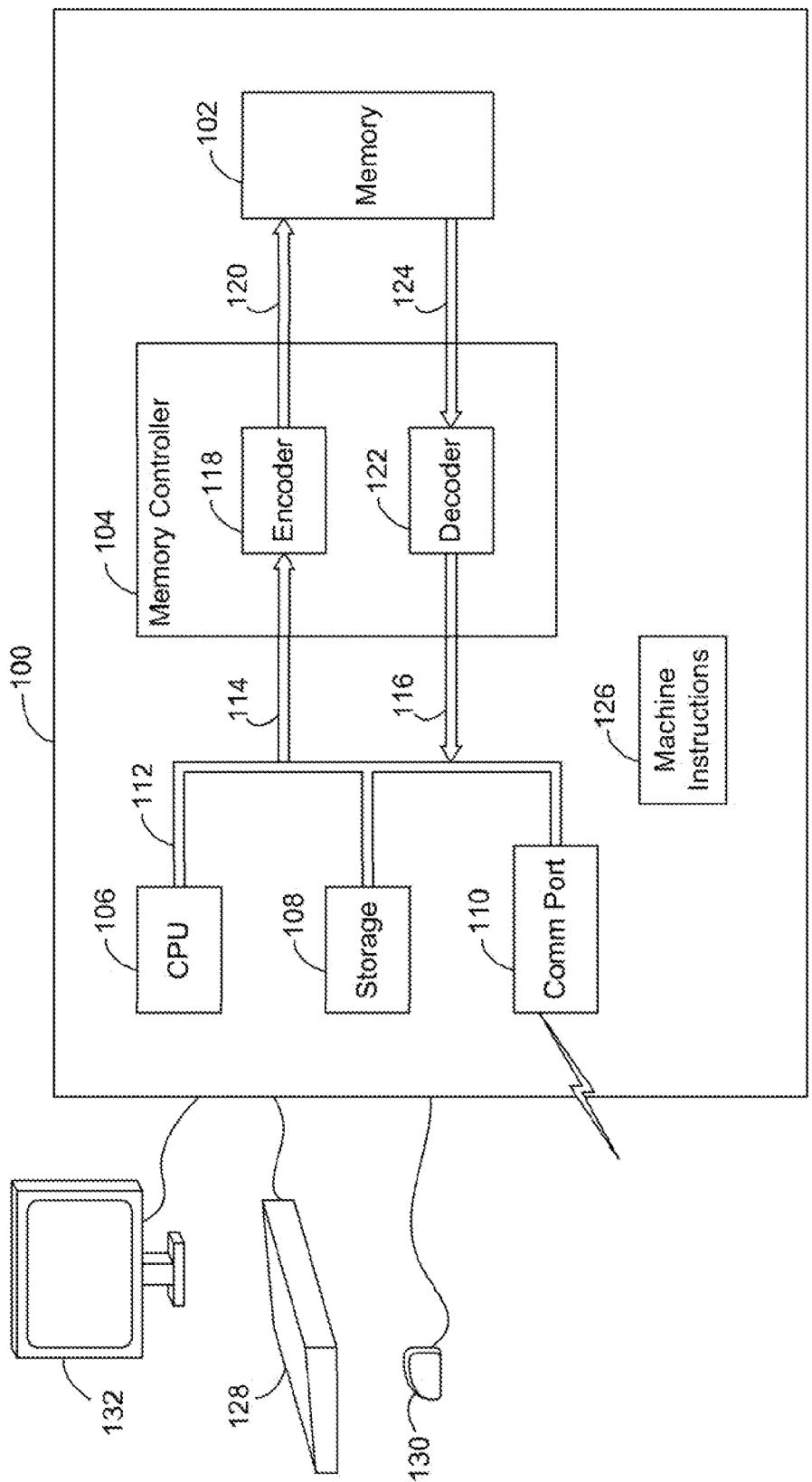
FIG. 1 is a block diagram of a computer system including a multi-state memory according to an example.

Illustrative examples and details are used in the drawings and in this description, but other configurations may exist and may suggest themselves. Parameters such as voltages, temperatures, dimensions, and component values are approximate. Terms of orientation such as up, down, top, and bottom are used only for convenience to indicate spatial relationships of components with respect to each other, and except as otherwise indicated, orientation with respect to external axes is not critical. For clarity, some known methods and structures have not been described in detail. Methods defined by the claims may comprise steps in addition to those listed, and except as indicated in the claims themselves the steps may be performed in another order than that given. Accordingly, the only limitations are imposed by the claims, not by the drawings or this description.

The systems and methods described herein may be implemented in various forms of hardware, software, firmware, special purpose processors, or a combination thereof. At least a portion thereof may be implemented as an application comprising program instructions that are tangibly embodied on one or more program storage devices such as hard disks, magnetic floppy disks, RAM, ROM, and CDROM, and executable by any device or machine comprising suitable architecture. Some or all of the instructions may be remotely stored and accessed through a communication facility; in one example, execution of remotely-accessed instructions may be referred to as cloud computing. Some of the constituent system components and process steps may be implemented in software, and therefore the connections between system modules or the logic flow of method steps may differ depending on the manner in which they are programmed.

When an electric potential is applied across a row conductor and a column conductor to activate a desired storage cell in a two-dimensional array of storage cells, only the storage cell connected between those two conductors will be fully activated. But all the other storage cells connected to either one of those conductors will be affected to some degree. The voltage applied to storage cells connected to either the activated row or the activated column may be called the half-select voltage, and some amount of current, called the half-select current, flows through each of these cells as a result of applying the half-select voltage. As the size of the array increases, the number of cells connected to each conductor also increases. This results in a larger half-select current whenever a potential is applied to a row conductor or a column conductor that is connected to these cells, especially if the number of cells in low-resistance states is large. Reliable storage and retrieval of data from such an array depends on minimizing or otherwise compensating for the half-select current. There is a need for a way to avoid adverse effects of the half-select current in accessing multi-state data storage cells connected between row conductors and column conductors in an array.

FIG. 1 gives an example of a computer system generally 100 with a memory 102 having a plurality of multi-state storage cells and a memory controller 104 that encodes data for storage in the memory, and decodes data retrieved from the memory, in a way that minimizes half-select currents. A multi-state memory having this encoding system avoids adverse effects of half-select currents and offers the potential of larger arrays of cells than would otherwise be practical.

The computer system 100 includes a CPU 106, data storage 108 such as a hard disk, and a communication port 110. These components are connected to each other and to other components, to be described presently, through a bus 112.

The memory controller 102 receives, through a portion 114 of the bus 112, data from other components for writing into the memory 102. The memory controller 104 provides, through a portion 116 of the bus 112, data that has been read from the memory 102. The memory controller 104 includes an encoder 118 that encodes data for writing in the memory 102 through a communication line 120 that may be part of the bus 112 or that may comprise a separate connection. As described in more detail below, the encoding is accomplished in such a way that half-select currents in the memory 102 are minimized. The memory controller 104 includes a decoder 122 that decodes data that is read from the memory 114 through a communication line 124 that may be part of the bus 108 or that may be a common communication line with the communication line 120, or that comprise a separate connection as in the example of FIG. 1.

Machine instructions 126 control the operation of the computer system. Some or all of the instructions may be contained in the storage 108, the memory 102, or in another component. Some or all of the instructions may be hard-wired. Some or all of the instructions may be remotely stored and retrieved as needed through the communication port 110.

Other components such as a keyboard 128, mouse 130, and visual display 132 may be provided as desired.

Figure 2:
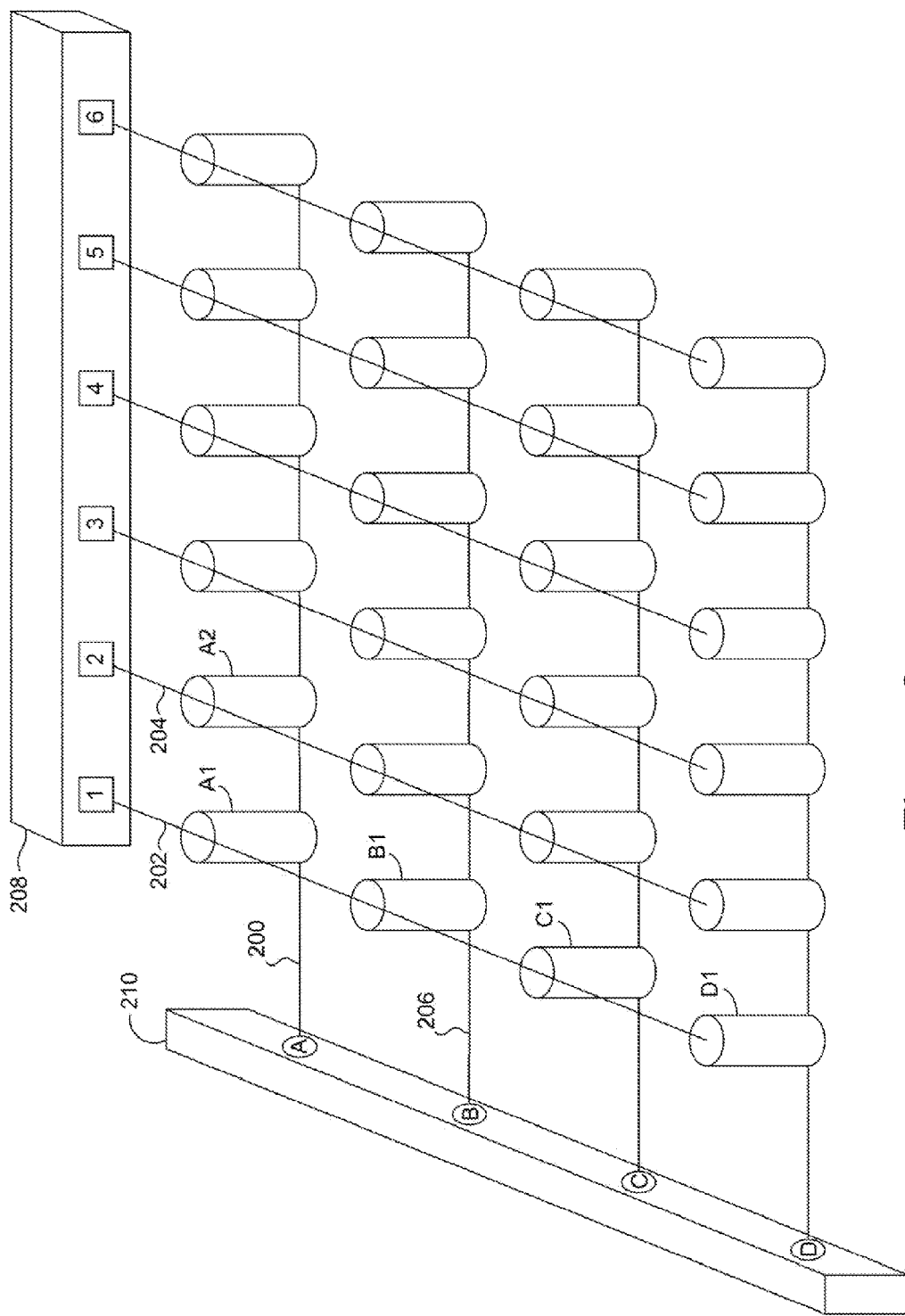
FIG. 2 is a block diagram of a multi-state memory configured as a two-dimensional storage array according to an example.

FIG. 2 gives an example of a multi-state memory configured as a two-dimensional storage array. In one example, such a multi-state memory may be fabricated as a cross-bar memristor structure. In another example, chalcogenide phase change memory (PCM) cells may be fabricated or connected in a similar manner.

The multi-state memory includes a plurality of individual multi-state cells each connected between a row conductor and a column conductor. For example, a multi-state cell A1 is connected between a row-A conductor 200 and a column-1 conductor 202, a cell A2 is connected between the row-A conductor 200 and a column-2 conductor 204, a cell B1 is connected between a row-B conductor 206 and the column-1 conductor 202, and so on. The column conductors are connected to a demultiplexer 208 and the row conductors are connected to a demultiplexer 210. In this example there are four rows and six columns, defining a 4×6 array, but in other examples there are other numbers of rows and columns. When a particular cell is to be accessed, appropriate control signals are applied by the demultiplexers to the row conductor and the column conductor between which that cell is connected.

In other examples some or all of the encoding, decoding, and multiplexing may be performed by the CPU or other components rather than by a separate encoder and decoder.

General Approach to Encoding Data to Minimize Half-Select Currents

In the multi-state memory shown in FIG. 2, a multi-state data storage cell can be programmed to be in any of a number s of states. A state may be a resistance or some other physical characteristic of the cell. In the examples to be discussed below, the state of a cell means the resistance of that cell. When a maximum half-select voltage is applied to a conductor connected to a plurality of these storage cells, for example the column-1 conductor 202 connected to the storage cells A1, B1, C1, and D1, the half-select currents passing through these storage cells may be represented as $$c_0 < c_1 < \ldots c_{s-1}$$

where $c_0$ represents the current flowing through a storage cell in state $s_0$ and so forth. For each x, it is further assumed that $$c_x + c_{s-1-x} \leq c_0 + c_{s-1} = C$$

where C is a constant that is determined by the characteristics of the storage cells, the size of the array, and the magnitude of the select voltage. For convenience, in the preceding equation and in the following discussion it will be assumed that the maximum of $c_x + c_{s-1-x}$ occurs at x=0, but this is not necessary.

The states of the storage cells in an m×n array structure such as a crossbar may be represented as an m×n array over the alphabet $$S = \{0, 1, \ldots, s-1\}.$$

A value of x for a given array entry will indicate that the device at the corresponding location in the crossbar is in that state which results in half-select current $c_x$. This half-select current will also be denoted using the functional notation $c(x) = c_x$. Array entries will be referenced using their row and column indices; specifically, the entry in row i and column j will be referred to using the ordered pair (i,j). Given an array A, the notation $A_{i,j}$ will denote entry (i,j) of that array.

In an m×n data storage array in which the operation of writing data to a cell of the array involves applying full select voltage across the row and column conductors of the selected storage cell and zero voltage on all the other conductors, the half-select leakage currents could be as much as $(n-1)c_{s-1}$ and $(m-1)c_{s-1}$ respectively. As noted above, $c_{s-1}$ is the maximum half-select current among the assumed devices.

Examples of methods of encoding and decoding a string of binary data will now be described. Encoding a string of binary data to, and decoding the data from, an m×n array over the alphabet S in the manner to be described will reduce the maximum half-select leakage current through the half-selected devices in the selected row and column.

Example of Encoding that Limits Half-select Currents

Encoding Constraints

In this example, the total half-select leakage current flowing through all the half-selected devices in a selected row of an m×n array is to be limited to about nC/2, and the half-select current through all the half-selected devices in a selected column is to be limited to about mC/2. The data string to be encoded is assumed to comprise about $(m-1)(n-1)\log_2 s + (m+n-1)\log_2(s/2)$ unconstrained bits; the exact number of bits will be described presently. This data string will be encoded to an m×n array of symbols from S, satisfying some constraints to be detailed below.

The description of this example begins with two constraints, expressed as inequalities (1) and (2), that the encoding must satisfy in order to limit the leakage current to the values given above. These inequalities are:

$$\text{for each } i: \frac{1}{n}\sum_{j=1}^{n} c(A_{i,j}) \leq \frac{C}{2} + \frac{\delta}{n} \quad (1)$$

$$\text{and for each } j: \frac{1}{m}\sum_{i=1}^{m} c(A_{i,j}) \leq \frac{C}{2} + \frac{\delta}{m} \quad (2)$$

where $\delta \leq \max_{0 \leq x \leq (s-1)/2} \{c(x+1)-c(x)\}$ in general, and $\delta = 0$ if $c(x) = ax+b$ for some constants a and b (affine in x), $c_{s-1}$ is the maximum of the half-select currents among the assumed device states, and $C/2 = (c_0 + c_{s-1})/2 \approx c_{s-1}/2$ provided $c_0 \ll c_{s-1}$ One-dimensional Mapping $f_A$ A mapping $f_A$ on one-dimensional sequences will now be described. Assume a set X of all sequences of length n over the set S of integers $\{0, 1, \ldots, s-1\}$:

$$X = \underbrace{S \times S \times \ldots \times S}_{n} = S^n$$

For a symbol string $x \in X$ define $$T_A(x) = \sum_{i=1}^{n} \frac{c(x_i) + c(s-1-x_i)}{2} \quad (3)$$

Now the mapping $y = f_A(x)$ maps X onto itself and has the following properties:

(1) if x is such that $\Sigma_i c(x_i) = T_A(x)$ then $y = x$ (2) for each i, $y_i \in \{x_i, s-1-x_i\}$ (3) if $\Sigma_i c(x_i) > T_A(x)$, then $\Sigma_i c(y_i) < T_A(x)$ and $c(y_i) \leq c(x_i)$ for all i (4) $f_A(f_A(x)) = x$ Constructions of $f_A$ will now be given for even values of $s = |S| \leq 8$. These constructions may be extended for larger $|S|$ if desired.

The Hamming weight of a bit string x refers to the number of 1's in x and will be represented as $|x|$ (=Hamming weight of bit string x). These constructions rely on a binary antipodal mapping $\phi$ that maps binary sequences of Hamming weight $k > n/2$ to sequences of Hamming weight $n-k < n/2$ in such a way that if $\hat{b} = \phi(b)$, $\hat{b}_i \leq b_i$ for each i;

$\phi(\phi(b)) = b$; and $\phi(b) = b$ if the Hamming weight of b is exactly $n/2$.

Binary Antipodal Mapping

A mapping is a way of converting a bit string x into a bit string y:

$$y = \phi(x).$$

The mapping $\phi$ is "antipodal" if it has the following properties:

the length n of bit-string x is the same as the length of bit-string y;

if $|x| = k$, then $|y| = n-k$;

if $|x| \geq n/2$, then $y_i \leq x_i$ for all i; and if $|x| < n/2$, then $y_i \geq x_i$ for all i.

A mapping $\mathcal{C}(x)$ is defined as reversing the order of all the bits and flipping them. A mapping $\mathcal{B}(x)$ from $\{0,1\}$ to $\{-1,1\}$ is defined as changing all 0 bits to $-1$. The polar string x' is defined as the result of performing the mapping $\mathcal{B}$ on the bit string x:

$$x' = \mathcal{B}(x).$$

This means that all the "0"s in x have been converted to "$-1$"s. The inverse of $\mathcal{B}$ is $\mathcal{B}^{-1}$:

$$x = \mathcal{B}^{-1}(x').$$

The Hamming weight of x is $\geq n/2$ if and only if the sum of entries of x' is $\geq 0$.

An example of flipping symbols in a row is to apply a mapping of the form:

$$f(h) = s - 1 - h$$

to each symbol in the row, where, as before, s is the number of states of the multi-state storage cells. Based on the binary representation with $s = 4$ this becomes:

values of 0 (i.e., binary 00) may be flipped to 3 (i.e., binary 11), values of 1 (i.e., binary 01) may be flipped to 2 (i.e., binary 10), values of 2 (i.e., binary 10) may be flipped to 1 (i.e., binary 01), and values of 3 (i.e., binary 11) may be flipped to 0 (i.e., binary 00).

A function Q is defined as generating the sum of a sequence of symbols from the polar string x' starting with the i-th symbol and adding together $\xi + 1$ polar bits and if necessary wrapping back to the first polar bit and continuing. Expressed in symbols:

$$Q(x', i, \xi) = x'_i + \ldots + x'_{(i+\xi) \bmod n}$$

where $(i+\xi) \bmod n$ refers to reduction to the range $1 \ldots n$. The sum of all the polar bits in a bit string x' is expressed as:

$$Q(x', 1, n) = x'_1 + \ldots + x'_n.$$

A set of minimal positions P in a polar bit string x' is $P_{x'}$. If a polar bit string x' has a sum greater than zero, its set of minimal positions is defined as $$i \in P_{x'} \text{ when } Q(x', i, \xi) > 0 \text{ for all } \xi \geq 0$$

In other words, a minimal position i is a position within the polar bit string for which $Q > 0$ for all possible $\xi \geq 0$. Positions with a polar value of $+1$ are candidates for being minimal positions. Positions with a polar value of $-1$ are not candidates, because $Q(x', i, 0) < 0$ for those positions.

A mapping $\phi'$ maps a polar bit stream x' of length n to a polar bit stream y' of length n:

$$y' = \phi'(x')$$

$$y'_i = x'_i \text{ for i not } \in P_{x'} \text{ and}$$

$$y'_i = -x'_i \text{ for i } \in P_{x'}$$

In other words, $\phi'$ inverts the value at each minimal position.

The foregoing discussion describes binary antipodal mappings and their properties. An example of a binary antipodal mapping using the above functions and definitions is:

$$y = \phi(x) = \mathcal{B}^{-1}(\phi'(\mathcal{B}(x))) \text{ for } |x| > n/2$$

$$y = \phi(x) = \mathcal{B}^{-1}(\mathcal{C}^{-1}(\phi'(\mathcal{B}(\mathcal{C}(x))))) \text{ for } |x| < n/2 \text{ for } |x| < n/2$$

$$y = \phi(x) = x \text{ for } |x| = n/2$$

There are many ways to generate binary antipodal mappings, and other such mappings may be used.

Mappings for Storage Cells Having Multiple States

Mappings $f_A$ used in the process of encoding binary data for storage in data storage cells each of which can assume more than two states will now be described.

For l=0, . . . , s/2−1 and a sequence x, define $I_l$ as a set of indices i in which $x_i$ takes a value equal either to l or to s−1−l:

$$I_l = \{i : x_i \in \{l, s-1-l\}\}.$$

The notation $x_{I_l}$ indicates the subsequence of symbols in x with indices in $I_l$. Also define $$w_\ell = \sum_{i \in I_\ell} c(x_i) - |I_\ell| \frac{(c(\ell) + c(s-1-\ell))}{2}.$$

Let $(\sigma_0, \sigma_1, \ldots, \sigma_{s/2-1})$ denote a permutation of the set $\{0, 1, \ldots, s/2-1\}$ satisfying $$|w_{\sigma_0}| \geq |w_{\sigma_1}| \geq \ldots \geq |w_{\sigma_{s/2-1}}|.$$

In other words, $(\sigma_0, \sigma_1, \ldots, \sigma_{s/2-1})$ is obtained by arranging $l \in \{0, 1, \ldots s/2-1\}$ in order of decreasing absolute values of $w_l$.

Define invertible mappings $u = b_l(v)$ between sequences over the alphabet $\{l, s-1-l\}$ and binary sequences as
$u_i = 0$ if $v_i = l$ and
$u_i = 1$ if $v_i = s-1-l$.

Now the mapping $y = f_A(x)$ is defined as follows.
Number of States s=2
If the number of states s=2 (in other words, binary data): $f_A$ is just the binary antipodal mapping $\phi$ as described above.
Number of States s=4
If the number of states s=4:
If $w_{\sigma_0} + w_{\sigma_1} = 0$, y=x.
If $w_{\sigma_0} + w_{\sigma_1} > 0$ and $|w_{\sigma_0}| \neq |w_{\sigma_1}|$, then.

$$y_{I_{\sigma_0}} = b_{\sigma_0}^{-1}(\phi(b_{\sigma_0}(x_{I_{\sigma_0}}))) \text{ and}$$

$$y_{I_{\sigma_1}} = x_{I_{\sigma_1}}.$$

In other words, the values of y in the positions corresponding to $I_{\sigma_0}$ are obtained by applying the binary antipodal map $\phi$ to the subsequence of the input x corresponding with the positions $I_{\sigma_0}$, with pre- and post-application of the above binary mapping and its inverse.

If $w_{\sigma_0} + w_{\sigma_1} > 0$ and $|w_{\sigma_0}| = |w_{\sigma_1}|$, then determine $$y_{I_{\sigma_0}}$$

as above, and $$y_{I_{\sigma_1}}$$

analogously, as $$y_{I_{\sigma_1}} = b_{\sigma_1}^{-1}(\phi(b_{\sigma_1}(x_{I_{\sigma_1}}))).$$

The above gives a bijection between sequences for which $w_{\sigma_0} + w_{\sigma_1} > 0$ and $w_{\sigma_0} + w_{\sigma_1} < 0$, so that y can be set to the inverse of this bijection when $w_{\sigma_0} + w_{\sigma_1} < 0$. The mapping $f_A$ thus constructed satisfies the properties (1) through (4).

In the general case (general s), as above, the binary antipodal map $b_f^{-1} \circ \phi \circ b_f$ will also be applied to the various subsequences $x_{I_l}$, as above. The decision to apply this binary antipodal map to any subsequence will depend on the values of the $w_{\sigma_0}, w_{\sigma_1}, \ldots, w_{\sigma_{s/2-1}}$, and the result of yet another binary mapping h.

Given the sequence $w_{\sigma_0}, w_{\sigma_1}, \ldots, w_{\sigma_{s/2-1}}$, if $|w_{\sigma_{s/2-1}}|$ is not >0, ignore the subsequence corresponding to $\sigma_{s/2-1}$ and use the procedure for s−2 and the remaining w's. But if $|w_{\sigma_{s/2-1}}| > 0$, let $R \subset \{+1,-1\}^{s/2}$ for which $$\sum_\ell r_\ell |w_{\sigma_\ell}| > 0$$

for all r∈R. Let $\bar{R}$ be obtained from R by negating all sequences in R. That is, $\bar{R} = \{-r : r \in R\}$. A 1-to-1 mapping h from R to $\bar{R}$ can be constructed with the property that if $\hat{r} = h(r)$ then $\hat{r}_i \leq r_i$.

In this discussion, R={A, B, C, D, . . . } and h(R)={X, Y, Z, W, . . . }. means that h(A)=X, h(B)=Y, h(C)=Z, h(D)=W, etc., where A, B, C, D, X, Y, Z, W stand for vectors of $\{-1, +1\}$.

The decision to apply the binary antipodal mapping to a given subsequence l is determined as follows. Select a predetermined h above on the basis of the sequence $$|w_{\sigma_0}|, |w_{\sigma_1}|, \ldots, |w_{\sigma_{s/2-1}}|.$$

If $$\sum_\ell w_{\sigma_\ell} > 0,$$

let $$r = \text{sgn}(w_{\sigma_0}), \text{sgn}(w_{\sigma_1}), \ldots, \text{sgn}(w_{\sigma_{s/2-1}})$$

where sgn(w) is +1 if w>0 and −1 if w<0

(all the $|w_l|$ are assumed to be non-zero) and $$\hat{r} = h(r).$$

Then if $$\hat{r}_l \neq r_l,$$

apply the binary antipodal mapping $b_{\sigma l}^{-1} \circ \phi \circ b_{\sigma_l}$ to $x_{I_l}$, otherwise, leave the subsequence alone. This mapping preserves the values of $|w_{\sigma_0}|, |w_{\sigma_1}|, \ldots, |w_{\sigma_{s/2-1}}|$ so that a decoder can reconstruct the set R and select the appropriate mapping h to invert and determine to which subsequences to apply the binary antipodal mapping (which is its own inverse).

The key to this approach is to construct explicitly the mapping h for the various subsets R that can arise.
Number of States s=6
Since s=6, there are three different R that can arise depending on the three possibilities
(a) $|w_{\sigma_0}| > |w_{\sigma_1}| + |w_{\sigma_2}|$
(b) $|w_{\sigma_0}| = |w_{\sigma_1}| + |w_{\sigma_2}|$
(c) $|w_{\sigma_0}| < |w_{\sigma_1}| + |w_{\sigma_2}|$ In (a), the first of these possibilities, R consists of all r for which $r_1 = +1$ and $h(r) = -r_1, r_2, r_3$, resulting in R={(+1, +1, +1), (+1, +1, −1), (+1, −1, +1), (+1, −1, −1)}
and h(R)={(−1, +1, +1), (−1, +1, −1), (−1, −1, +1), (−1, −1, −1)}.

In (b), the second possibility,

R={(+1, +1, +1), (+1, −1, +1), (+1, +1, −1)} with h(R)={(−1, −1, −1), (−1, −1, +1), (−1, +1, −1)}.

In (c), the third possibility,

R={(−1, +1, +1), (+1, +1, +1), (+1, −1, +1), (+1, +1, −1)} with h(R)={(−1, +1, −1), (−1, −1, −1), (−1, −1, +1), (+1, −1, −1)}.

The sequences in the corresponding positions in R and h(R) are the pre- and post-mapped sequences. Other suitable choices of h may also be used.

For s=4, the set R and a possible mapping h are given by:

if $|w_{\sigma_0}| > |w_{\sigma_1}|$

R={(+1, +1), (+1, −1)} h(+1, +1)=(−1, +1) and h(+1, −1)=(−1, −1)} if $|w_{\sigma_0}| = |w_{\sigma_1}|$

R={(+1, +1)} h(+1, +1)=(−1, +1)

In the case s=4, the desired map $f_A$ was constructed by selectively applying the binary antipodal map to some subsequences $x_{I_f}$. This technique can be generalized to other values of s.

Number of States s=8:

If $|w_{\sigma_0}| > |w_{\sigma_1}| + |w_{\sigma_2}| + |w_{\sigma_3}|$ match by filling the first bit:

| R | | | | | h(R) | | | |
|---|---|---|---|---|---|---|---|---|
| +1 | −1 | −1 | −1 | ↔ | −1 | −1 | −1 | −1 |
| +1 | −1 | −1 | +1 | ↔ | −1 | −1 | −1 | +1 |
| +1 | −1 | +1 | −1 | ↔ | −1 | −1 | +1 | −1 |
| +1 | −1 | +1 | +1 | ↔ | −1 | −1 | +1 | +1 |
| +1 | +1 | −1 | −1 | ↔ | −1 | +1 | −1 | −1 |
| +1 | +1 | −1 | +1 | ↔ | −1 | +1 | −1 | +1 |
| +1 | +1 | +1 | −1 | ↔ | −1 | +1 | +1 | −1 |
| +1 | +1 | +1 | +1 | ↔ | −1 | +1 | +1 | +1 |

If $|w_{\sigma_0}| = |w_{\sigma_1}| + |w_{\sigma_2}| + |w_{\sigma_3}|$:

| R | | | | | h(R) | | | |
|---|---|---|---|---|---|---|---|---|
| +1 | −1 | −1 | −1 | ↔ | −1 | −1 | −1 | −1 |
| +1 | −1 | −1 | +1 | ↔ | −1 | −1 | −1 | −1 |
| +1 | +1 | −1 | −1 | ↔ | −1 | +1 | −1 | −1 |
| +1 | −1 | +1 | −1 | ↔ | −1 | −1 | +1 | +1 |
| +1 | +1 | −1 | +1 | ↔ | −1 | +1 | −1 | −1 |
| +1 | +1 | −1 | −1 | ↔ | −1 | +1 | −1 | −1 |
| +1 | +1 | +1 | +1 | ↔ | −1 | +1 | +1 | +1 |

If $|w_{\sigma_1}| + |w_{\sigma_2}| < |w_{\sigma_0}| + |w_{\sigma_3}|$:

| R | | | | | h(R) | | | |
|---|---|---|---|---|---|---|---|---|
| +1 | −1 | −1 | +1 | ↔ | −1 | −1 | −1 | −1 |
| +1 | +1 | +1 | +1 | ↔ | −1 | +1 | +1 | −1 |
| −1 | +1 | +1 | +1 | ↔ | −1 | −1 | −1 | +1 |
| +1 | −1 | +1 | −1 | ↔ | −1 | −1 | +1 | −1 |
| +1 | −1 | −1 | −1 | ↔ | −1 | +1 | −1 | −1 |
| +1 | +1 | +1 | −1 | ↔ | +1 | −1 | −1 | −1 |
| +1 | −1 | +1 | +1 | ↔ | −1 | −1 | +1 | +1 |
| +1 | +1 | −1 | +1 | ↔ | −1 | +1 | −1 | +1 |

If $|w_{\sigma_1}| + |w_{\sigma_2}| > |w_{\sigma_0}| + |w_{\sigma_3}|$:

| R | | | | | h(R) | | | |
|---|---|---|---|---|---|---|---|---|
| +1 | −1 | −1 | +1 | ↔ | −1 | −1 | −1 | −1 |
| +1 | +1 | +1 | +1 | ↔ | +1 | −1 | −1 | +1 |
| −1 | +1 | +1 | +1 | ↔ | −1 | −1 | −1 | +1 |
| +1 | −1 | +1 | −1 | ↔ | −1 | −1 | +1 | −1 |
| +1 | +1 | −1 | −1 | ↔ | −1 | +1 | −1 | −1 |
| +1 | +1 | +1 | −1 | ↔ | +1 | −1 | −1 | −1 |
| +1 | −1 | +1 | +1 | ↔ | −1 | −1 | +1 | +1 |
| +1 | +1 | −1 | +1 | ↔ | −1 | +1 | −1 | +1 |

If $|w_{\sigma_1}| + |w_{\sigma_2}| = |w_{\sigma_0}| + |w_{\sigma_3}|$:

| R | | | | | h(R) | | | |
|---|---|---|---|---|---|---|---|---|
| +1 | +1 | +1 | +1 | ↔ | −1 | −1 | −1 | −1 |
| −1 | +1 | +1 | +1 | ↔ | −1 | −1 | −1 | +1 |
| +1 | −1 | +1 | −1 | ↔ | −1 | −1 | +1 | −1 |
| +1 | +1 | −1 | −1 | ↔ | −1 | +1 | −1 | −1 |
| +1 | +1 | −1 | −1 | ↔ | +1 | −1 | −1 | −1 |
| +1 | −1 | +1 | +1 | ↔ | −1 | −1 | +1 | +1 |
| +1 | +1 | −1 | +1 | ↔ | −1 | +1 | −1 | +1 |

Encoding

Now the mappings $f_A$ as described above will be applied to encode a binary data string. For convenience, in this discussion it will be assumed that s is a power of 2, but this is not essential because the discussion can be extended to the general case using straightforward techniques. Let $\mathcal{R}$ indicate the number of bits to be encoded. In one example $\mathcal{R}$ is $\mathcal{R} = (m-1)(n-1)-1)\log_2 s + (m+n-4)\log_2 s/2 + 4 \log_2 s/4$ and $s = 2^k$ where k is an integer so that S={0, 1, ..., $2^k$−1}.

An m×n output array that satisfies inequalities (1) and (2) above is to be formed by encoding an arbitrary string of $\mathcal{R}$ binary data bits denoted as u.

A first sequence of symbols over the alphabet S is formed by grouping the first ((m−1)(n−1)−1)k bits of it into (m−1)(n−1)−1 groups of k bits each. Each such group, by means of the binary (base 2) representation of integers, corresponds to one of the symbols in S.

This first sequence is arranged into an (m−1)×(n−1) array (Array 1) excluding the position (m−1, n−1). More specifically, the first n−1 symbols are placed in the first row, the next n−1 symbols are placed in the second row, and so on, but only n−2 symbols are placed in the $(m-1)^{st}$ row.

A second sequence of symbols over an alphabet S' is formed by grouping the succeeding (m+n−4)(k−1) bits of a into groups of k−1 bits each. Each such group, by means of the binary (base 2) representation of integers, corresponds to one of the symbols in S'. S' is given by:

$$S' = \{0, 2, \ldots, s/2-2, s/2+1, \ldots, s-3, s-1\} \subset S \text{ of size } s/2 \quad (5)$$

Array 1 is now extended into an m×n array (Array 2) by filling in the first n−2 entries of the m-th row and the first m−2 entries of the n-th column (a total of m+n−4 entries) using the second sequence.

A third sequence of symbols, over the alphabet S, is formed by grouping the last bits of u into four groups of k−2 bits each, interpreted as symbols in $\{0, 1, \ldots, (s/4-1)\}$. Of course, if k=2, these last four groups will be void. The four entries in the as-yet-empty 2×2 subarray in the lower right-hand corner of Array 2 are filled with the third sequence to form a completed m×n array (Array 3). If k=2, the entries in Array 3 will all be zero.

The mapping $f_A$ is applied to those of the first in m−2 rows of Array 3 that satisfy a row condition of the half-select currents, for example the inequality:

$$\sum_{j=1}^{n} c(A_{i,j}) > T_A(A_{i,1}, \ldots, A_{i,n}) \quad (4)$$

($T_A$ is defined in equation (3) above) to form Array 4. Each of these (m−2) rows of Array 3 that satisfy inequality (4) is replaced with its corresponding mapped row. The last entry of each mapped row is modified by adding 1 to it if it is smaller than (s−1)/2 and subtracting 1 from it if it is larger than (s−1)/2.

The mapping $f_A$ is applied to the first n−2 entries of row m−1 if inequality (4) is satisfied when applied to those entries. If the mapping is applied to those entries, $2^{k-2}$ is added to the array entry $A_{m-1, n-1}$.

The mapping $f_A$ is applied to those of the first n−2 columns of Array 4 that satisfy a column condition of the half-select currents, for example the inequality:

$$\sum_{i=1}^{m} c(A_{i,j}) > T_A(A_{i,j}, \ldots, A_{m,j}) \quad (5)$$

to form Array 5. Each of these (n−2) columns of Array 4 that satisfy inequality (5) is replaced with its corresponding mapped column. The last entry of each mapped column is modified by adding 1 to it if it is smaller than (s−1)/2 and subtracting 1 from it if it is larger than (s−1)/2.

The mapping $f_A$ is applied to the first m−2 entries of the second-to-last and last columns if inequality (5) is satisfied when applied to these entries to form Array 6. If the mapping is applied to those entries of the second-to-last column, $2^{k-1}$ is added to the array entry $A_{m-1, n}$. If the mapping is applied to those entries of the last column, $2^{k-1}$ is added to the array entry $A_{m, n-1}$.

If the first n−2 entries of the last row of Array 6 do not satisfy inequality (4) as applied only to those entries, Array 6 is the output m×n array that is ready for storage. But if the first n−2 entries of the last row of Array 6 satisfy inequality (4) as applied only to those entries, the mapping $f_A$ is applied to this partial row and $2^{k-2}$ is added to the array entry $A_{m, n}$, and the resulting array is the output m×n array that is ready for storage.

The output m×n array satisfies the constraints in inequalities (1) and (2). This follows from property (3) of $f_A$ that:

if $\Sigma_i c(x_i) > T_A(x)$, then $\Sigma_i c(y_i) < T_A(x)$ and $c(y_i) \leq c(x_i)$ for all $i$, where $y = f_A(x)$.

The encoding is reversible. Specifically, the information in the lower right-hand corner 2×2 subarray, together with the modifications of the entries in the last row and column during encoding, are used to reverse the encoding and obtain the original binary input u.

In other examples a different set of four entries, rather than the lower right-hand corner, is used to record operations needed for decoding. If the alphabet size $s=2^k$ with k>2, fewer entries than 4 (for example, a 2×1 or a 1×1 subarray) can be used to record the operations needed for decoding.

Example of Another Encoding that Limits Half-select Current

Encoding Constraints

In this example, for simplicity it is assumed that m=n although it is possible to generalize to examples where m≠n. The leakage current through half-selected devices is limited to about $nC_B$ and $nC_B$ respectively, where $$C_B = \max_{x_1, \ldots, x_n \in S^n : \Sigma_k x_k \leq n(s-1)/2} \frac{1}{n} \sum_{j=1}^{n} c(x_k).$$

$C_B = C/2$ under certain conditions, one of which is that c(x) is convex or concave in x. This includes the affine case mentioned above for which δ=0. Under other conditions, for example if c(x) is nearly a step function centered at the point (C/2, s/2), $C_B$ can be significantly greater than C/2, but such curves generally do not arise in practice.

The data string to be encoded is assumed to comprise about $(n-1)^2 \log_2 s + (2n-1) \log_2(s/2)$ unconstrained bits. More precisely, the encoder receives as input (n−1)(nk−1)+(n−1)(k−1)+k−3 bits.

The description of this example begins with a constraint, expressed as inequality (6), that the encoding must satisfy in order to limit the leakage current to $nC_B$:

$$\frac{1}{n} \sum_{j=1}^{n} c(A_{i,j}) \leq C_B \quad (6)$$

Example of Computing a One-Dimensional Mapping $f_B$

A one-dimensional mapping for this example corresponds with the one-dimensional mapping previously described except as follows. This mapping will be denoted as $f_B$. Let $$T_B = n(s-1)/2.$$

The mapping $f_B$ maps $X=S^n$ to itself and has the following properties:
(5) if x is such that $\Sigma_i x_i = T_B(x)$ then y=x,
(6) if $\Sigma_i x_i > T_B(x)$, then $\Sigma_i y_i < T_B(x)$ and $y_i \leq x_i$; for all i, and
(7) $f_B(f_B(x)) = x$ The mapping $f_B$ is based on the following unary coding of the alphabet S:

$$S = \{0, \ldots, s-1\}$$

into binary sequences of length s−1:

$$g(x) = \underbrace{0, 0, \ldots, 0}_{s-1-x}, \underbrace{1, 1, \ldots, 1}_{x}.$$

Thus, x is mapped to a binary sequence of length s−1 with s−1−x initial zeros followed by x ones. The mapping g(x) is invertible and extensible to sequences x over X by:

$$g(x) = g(x_1), g(x_2), \ldots, g(x_n),$$

the concatenation of the symbol-wise mappings. The sequence extension is also invertible.

The mapping $y = f_B(x)$ is then defined as:

$$y = g^{-1}(\phi(g(x)))$$

where $\phi$ is the binary antipodal mapping described above. The binary antipodal mapping $\phi$ has the property that $\phi(g(x))$ is in the image of g applied to X so that the inverse mapping $g^{-1}$ above is well defined on $\phi(g(x))$.

Another Example of Computing the Mapping $f_B$

This procedure provides a computationally-efficient way to compute the mapping $f_B$. The procedure uses as input the vector x in X and provides as output $y = f_B(x)$.

```
Variables
    i
    t in Z/nZ (arithmetic modulo n)
    d
    S
    W in Z (plain integers
Procedure
    Set t = 0, d = 0, S = 0
    for i = 1 to n − 1 do
        S = S + ( c(x_{i−1}) + c(x_i) )/2;
        if S ≤ d then
            d = S;
            t = i;
        end if
    end for
    y = x;
    W = c(x);
    while W > 0 do
        d = 0;
        while d ≤ 0 do
            d = d + ( c(x_{t−1}) + c(x_t) )/2;
            t = t − 1;
        end while
        y_t = x_t − d;
        W = W − d;
    end while
    return y.
```

Encoding

Now the mappings $f_B$ as described above will be applied to encode a binary data string into an n×n array.

When n is even, the parity of the sum is preserved by the mapping $f_B$. When n is odd and s is even, the parity is flipped. Let $E_n$ denote all the words in $X = S^n$ whose sum of entries is even, and consider the following mapping $f'_B$ defined for every x in $E_n$, assuming s is even:

(8) if the sum of entries in x is at most n(s−1)/2, then $f'_B(x) = x$, (9) if not, and n is odd, then $f'_B(x) = f_B(x)$, and

(10) if not, and n is even, then $f'_B(x)$ is $y = f_B(x)$ followed by adding 1 (modulo s) to the last entry in y.

Given $f'_B(x)$, (8) and (9) can be distinguished by the parity of the sum of $f'_B(x)$. Also, the sum of the components of $y = f_B(x)$ is always at most n(s−1)/2. In (10), the mapping $f_B$ is applied to a word x with sum at least n(s−1)/2+1, so the image of the matching will have sum at most n(s−1)/2−1. This allows 1 to be added without violating the constraint.

The first n−1 rows of the array are filled with s-ary symbols obtained from the data bits such that the parity of each row sum is even. This is accomplished by using just k−1 bits of data (rather than the usual k) for the last symbol in each of these rows, and adding a parity bit. Thus each row has one bit of redundancy, and the total number of data bits consumed in this step is (n−1)(nk−1).

$f'_B$ is applied to each row. In some examples, a simpler function could be used in lieu of $f'_B$, corresponding to an s-ary flipping of vectors x whose sum of entries exceeds n(s−1)/2.

The last row is filled with s-ary symbols obtained from the input bits. These symbols are obtained such that:

(a) the parity of each of the first n−1 entries should match the parity of the sum of entries 1 . . . n−1 in the respective column above (namely, the j-th entry of the last row should be chosen so that the overall sum of entries in the j-th column is even and thus the total number of data bits consumed in this step is (n−1)(k−1)); and (b) the lower-right entry in the array should be at most s/2−3 and should be divisible by four; this allows for (k−3) bits of data, for a total of (n−1)(nk−1)+(n−1)(k−1)+(k−3). This implies that s≥6. If s=4, a 2×2 subarray of entries is restricted to be binary and indicates whether the mapping $f_B$ was applied to the last two partial columns and last two partial rows, as in the previous example.

$f'_B$ is applied to each of the first n−1 columns. If the sum of the first n−1 entries of the last column is greater than (n−1)(s−1)/2, apply the mapping $f_B$ to them and add 1 to the lower-right entry. If the sum of the first n−1 entries of the last row is greater than (n−1)(s−1)/2, apply the mapping $f_B$ to them and add 2 to the lower-right entry. This encoding is reversible, as was the encoding in the previous example, by using the information in the lower right-hand corner of the array.

Multi-state Memory System with Encoding that Minimizes Half-select Currents

Figure 3:
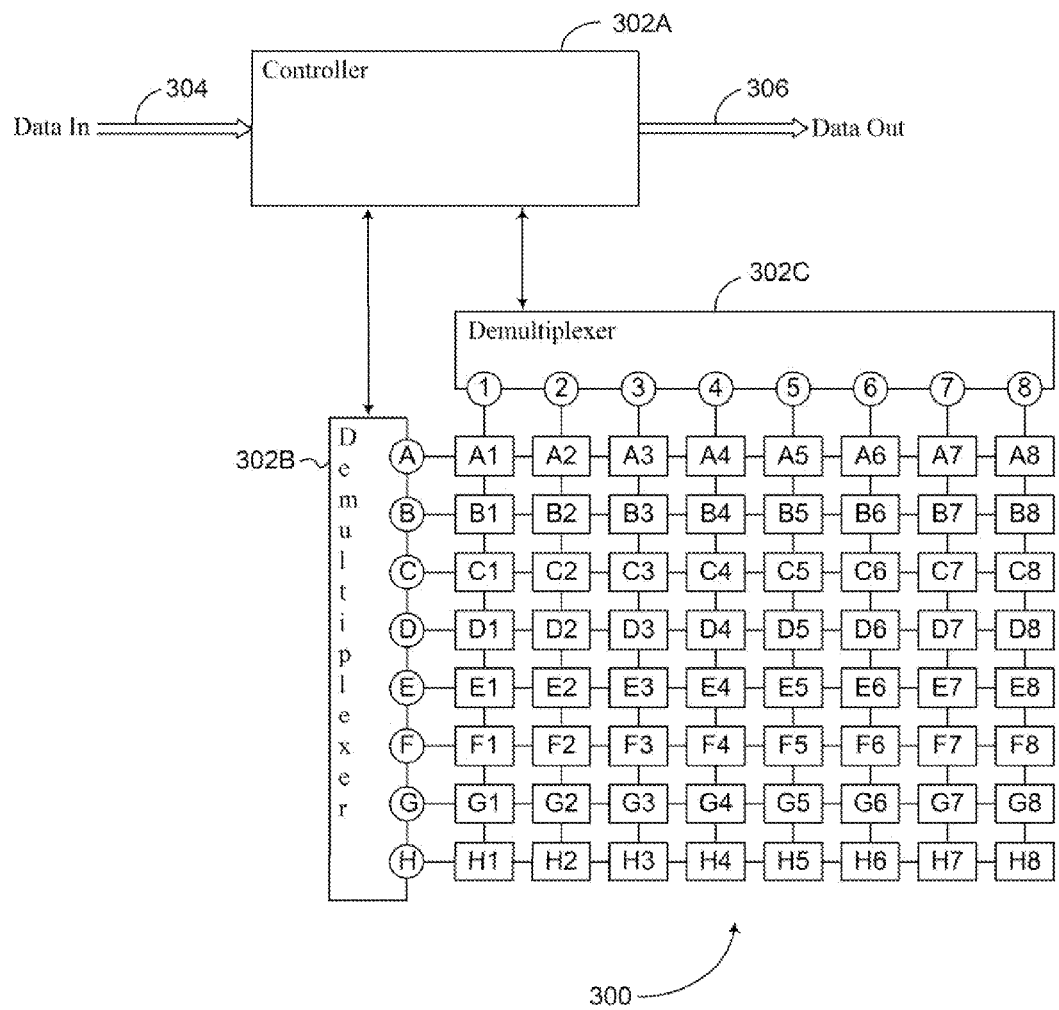
FIG. 3 is a block diagram of a multi-state memory system with encoding that minimizes half-select currents according to an example.

FIG. 3 depicts an example of a multi-state memory system with encoding that minimizes half-select currents. The system includes an array generally 300 of row conductors and column conductors and, at each crossing of a row conductor and a column conductor, a multi-state storage cell connected between those conductors. In the example shown, there are eight column conductors designated 1 through 8, and eight row conductors designated A through H. In other examples there are other numbers of row and column conductors. In some examples the number of row conductors is not equal to the number of column conductors.

A multi-state storage cell A1 is connected between column 1 and row A. Similarly, a multi-state storage cell A2 is connected between column 2 and row A, a multi-state storage cell B1 is connected between column 1 and row B, and so on. Each storage cell is capable of being placed into any of three or more resistance states.

An encoder is connected to apply activation signals to the row conductors and column conductors. For convenience in discussing the operation of the memory system, the encoder is shown as three discrete connected units including a controller 302A, a row demultiplexer 302B, and a column demultiplexer 302C, but in other examples these three functions may be performed by a single device.

Figure 4:
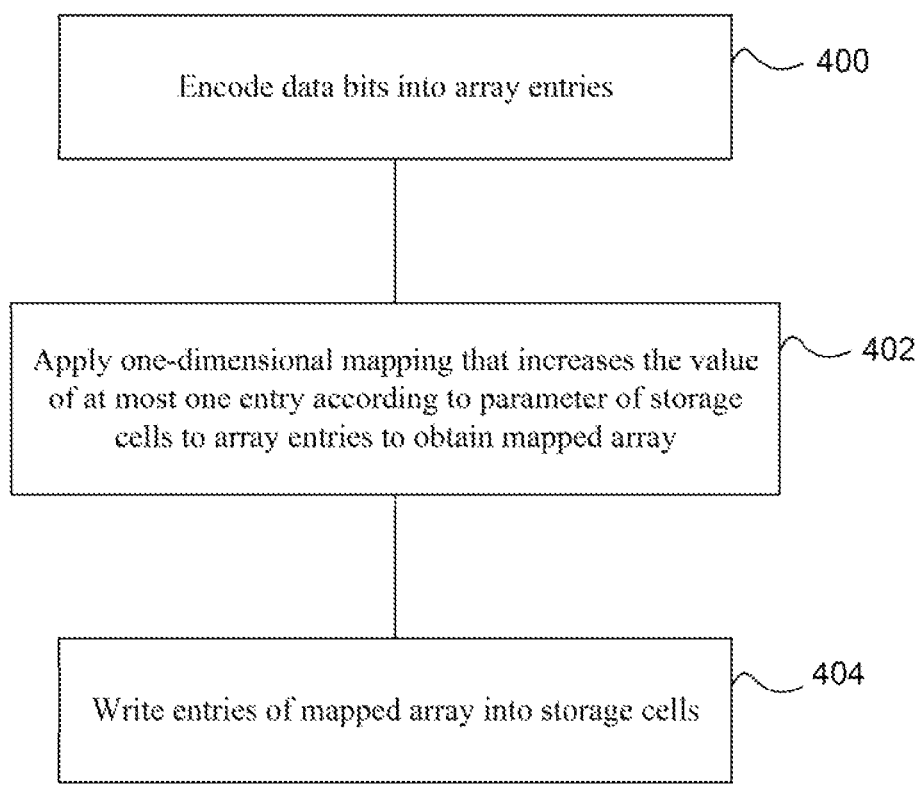
FIG. 4 is a flowchart giving an example of programming an encoder.

The controller 302A receives data for storage through a bus 304. Referring now to FIG. 4, the encoder is programmed to encode (400) the data bits into entries in an array having one row corresponding with each row conductor and one column corresponding with each column conductor; apply (402) a predetermined one-dimensional one-to-one (invertible) mapping that increases the value of at most one entry according to half-select currents of the storage cells to the array entries to obtain a mapped array; and write (406) entries of the mapped array into the storage cells. In some examples the mapping does not increase the value of any array entry.

In some examples the controller 302A writes entries into a given storage cell by causing the row demultiplexer 302B to apply a control voltage to a row conductor to which that cell is connected, and the column demultiplexer 302C to apply a control voltage to a column conductor to which that cell is connected. The magnitude of these control voltages determines the state into which that cell will be placed. This process is repeated as desired to write to other cells or to write to the entire array.

The half-select current of a cell may be the same for more than one of the states into which the cell may be placed, or each state may have a different half-select current. For example, if the storage cells can be placed into any of four different states, the half-select currents associated with these states might be

| State | Half-select current |
|---|---|
| $c_0$ | 25 μA |
| $c_1$ | 30 μA |
| $c_2$ | 32 μA |
| $c_3$ | 38 μA |

In some examples the decoder is connected to read information from the storage cells, for example by measuring the resistance states of the cells. This may be done for a given cell by applying appropriate voltages across the row and column between which that cell is connected, and measuring the resulting current flow. The decoder is also connected to provide data bits according to the information read from the cells, for example through a bus 306.

Figure 5:
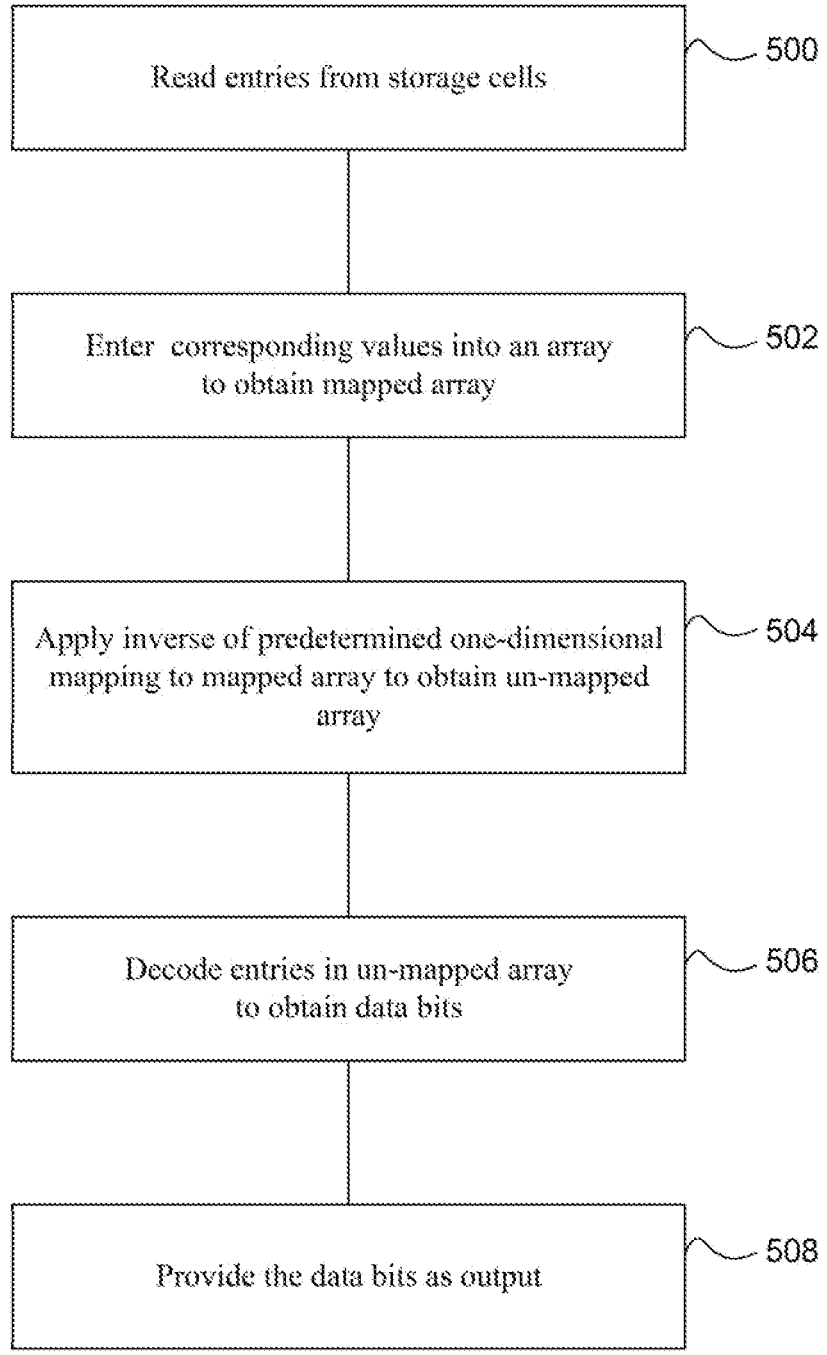
FIG. 5 is a flowchart giving an example of programming a decoder.

Referring now to FIG. 5, the decoder is programmed to read (500) entries from the storage cells; enter (502) values corresponding with the entries from the storage cells into an array having one row corresponding with each row conductor and one column corresponding with each column conductor to obtain a mapped array; apply (504) the inverse of a predetermined one-dimensional mapping to the rows and columns of the array to obtain an un-mapped array; decode (506) the entries in the un-mapped array into data bits; and provide (508) the data bits as an output.

In some examples the storage cells comprise memristors. The memristors may be fabricated in a cross-bar array structure. In other examples the storage cells comprise chalcogenide phase change memory cells.

Method of Storing Data Bits to Minimize Half-select Currents

Figure 6:
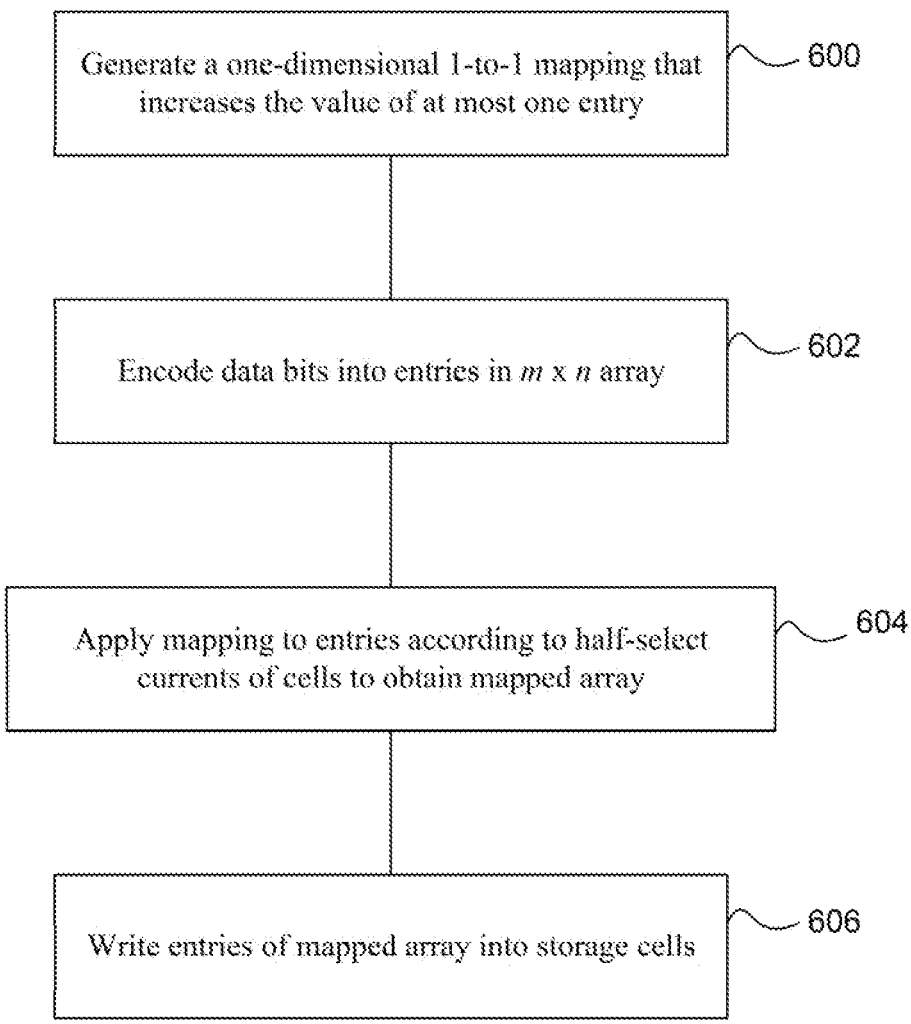
FIG. 6 is a flowchart giving an example of a method of storing data bits to minimize half-select currents in a multi-state memory system.

FIG. 6 gives an example of a method of storing data bits to minimize half-select currents in a multi-state memory system having a plurality of storage cells each capable of being placed into any of at least three different states. The method includes generating (600) a one-dimensional one-to-one mapping that increases the value of at most one array entry, encoding (602) the data bits into entries in an array having m rows and n columns, applying (604) the mapping to the entries according to half-select currents of the storage cells to obtain a mapped array, and writing (606) entries of the mapped array into the storage cells. In some examples the mapping does not increase the value of any array entry.

Figure 7:
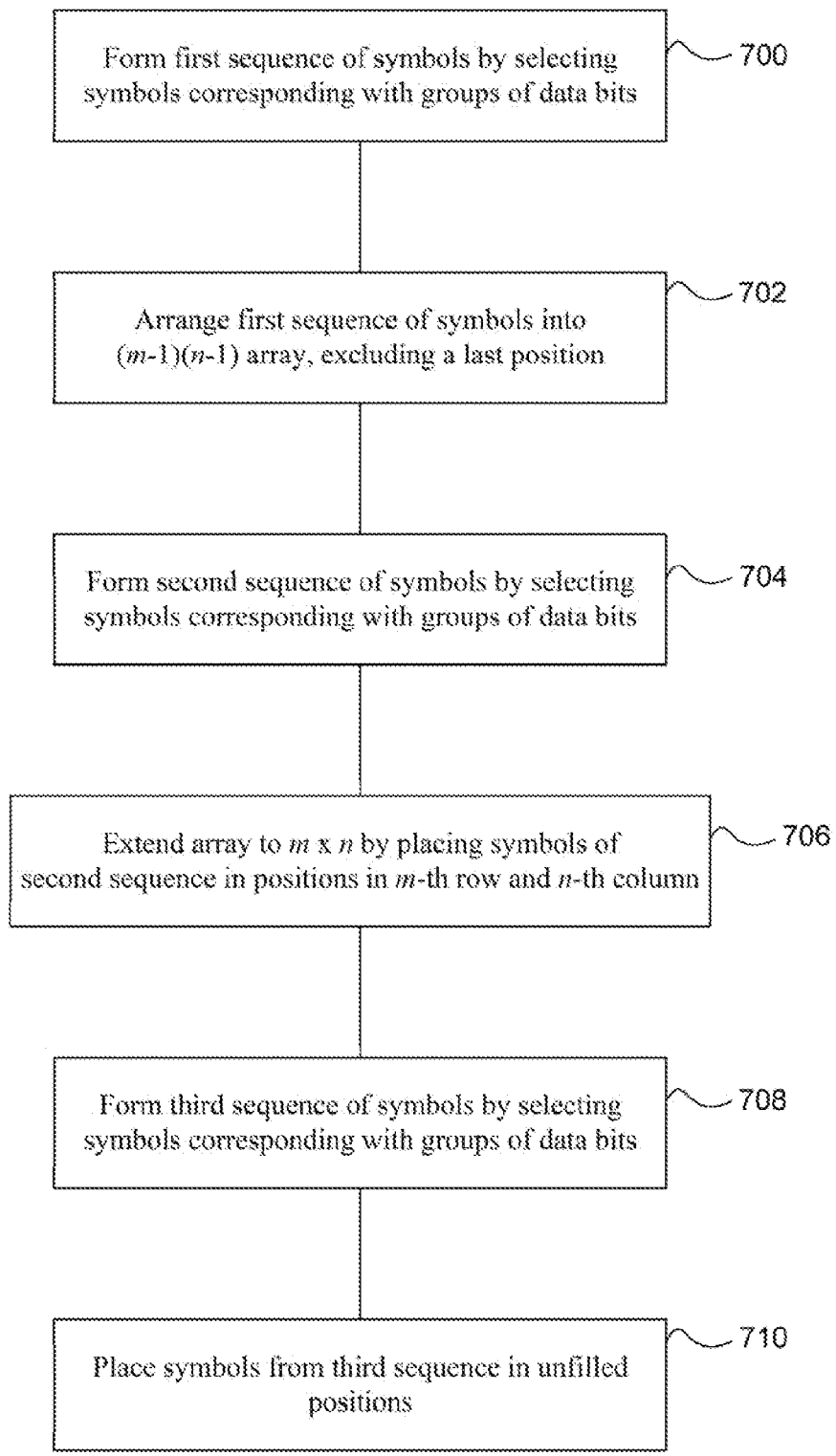
FIG. 7 is a flowchart giving examples of encoding data bits for storage.

FIG. 7 gives examples of encoding the data bits. A first sequence of symbols is formed (700) by selecting from a first alphabet symbols corresponding with groups of data bits. The first sequence of symbols is arranged (702) into an (m−1)×(n−1) array by placing the first n−1 symbols in a first row of the array, the next n−1 symbols in the second row, and so on. A first predetermined array position is excluded; this may be the last position as described above, or another position. A second sequence of symbols is formed (704) by selecting from a second alphabet symbols corresponding with groups of data bits. The (m−1)×(n−1) array is extended (706) into an m×n array by placing the symbols of the second sequence in the first in n−2 entries of the m-th row and the first in m−2 entries of the n-th column. A third sequence of symbols is formed (708) by selecting from the first alphabet symbols corresponding with groups of data bits. The symbols of the third sequence are placed (710) in any unfilled positions.

Figure 8:
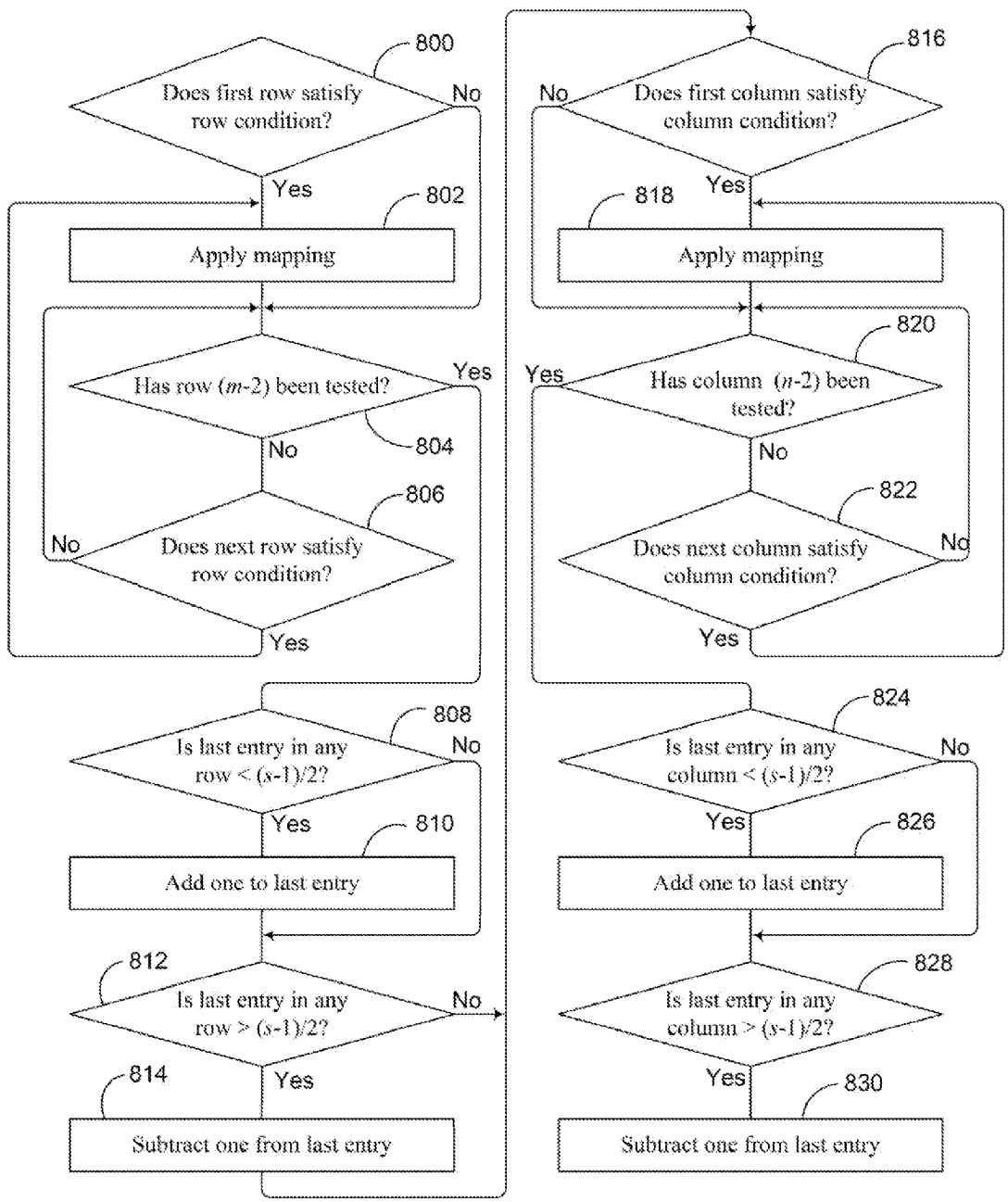
FIG. 8 is a flowchart giving an example of selecting rows and columns of an array to be mapped.

In some examples, selecting entries in the array includes selecting from the first (m−2) rows each row that satisfies a half-select-current row condition, and selecting from the first (n−2) columns each column that satisfies a half-select-current column condition. As shown in FIG. 8, an example of this is to test (800) the first row of the array against the row condition. In some examples the row condition is inequality (4) above. If the row being tested satisfies the row condition, mapping is applied (802) to the row. If row (m−2) has not yet been tested (804), the next row is tested (806) against the row condition. If this row satisfies the row condition, mapping is applied (802) to the row and the process continues until row (m−2) has been tested. If (808) the last entry in any row is less than $(s-1)/2$, one is added (810) to that entry. If (812) the last entry in any row is more than $(s-1)/2$, one is subtracted (814) from that entry. Then the first column is tested (816) against the half-select current column condition, which in some examples is inequality (5) above. If the column being tested satisfies the column condition, mapping is applied (818) to the column. If column (n−2) has not yet been tested (820), the next column is tested (822) against the column condition. If this column satisfies the column condition, mapping is applied (818) to the column and the process continues until column (n−2) has been tested. If the last entry in any column is less than $(s-1)/2$ (824), one is added (826) to that entry. If the last entry in any row is more than $(s-1)/2$ (828), one is subtracted (830) from that entry.

Figure 9:
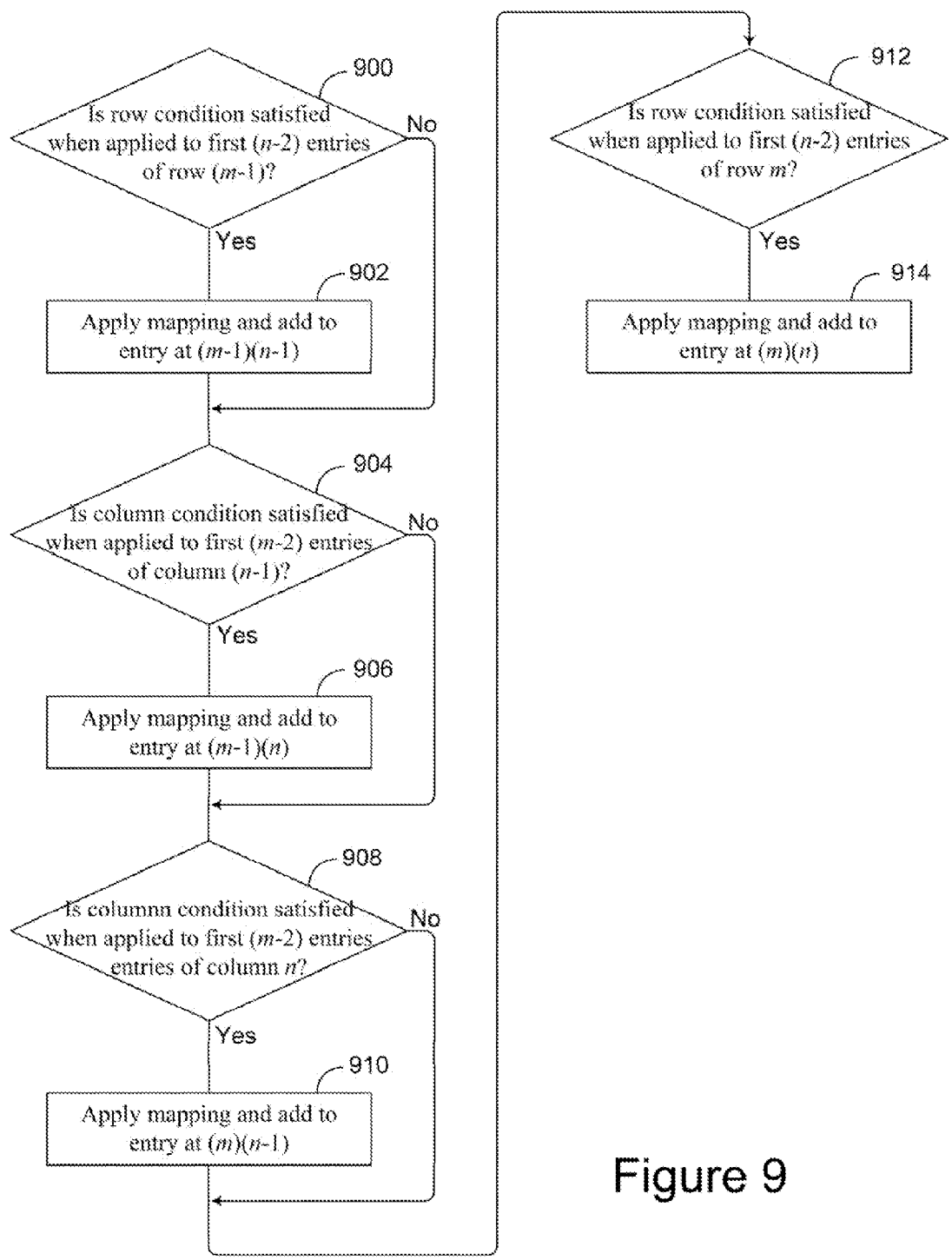
FIG. 9 is a flowchart giving an example of applying mapping to selected rows and columns.

As shown in FIG. 9, in some examples the first (n−2) entries in the next-to-last row (row (m−1)) are tested (900) against the row condition. If these entries satisfy the row condition, mapping is applied (902) to these entries and an addition is made (1 is added in the examples discussed previously) to the last entry in the row, at (m−1)(n−1). The first (m−2) entries in the next-to-last column (column (n−1)) are tested (904) against the column condition. If these entries satisfy the column condition, mapping is applied (906) to these entries and addition is made (1 in the examples discussed previously) to the entry at (m−1)(n). The first (m−2) entries in the last column (column n) are tested (908) against the column condition. If these entries satisfy the column condition, mapping is applied (910) to these entries and addition is made (1 in the examples discussed previously) to the entry at (m)(n−1). The first (n−2) entries in the last row (row m) are tested (912) against the row condition. If these entries satisfy the row condition, mapping is applied (914) to these entries and addition is made (1 in the examples discussed previously) to the entry at (m)(n).

Figure 10:
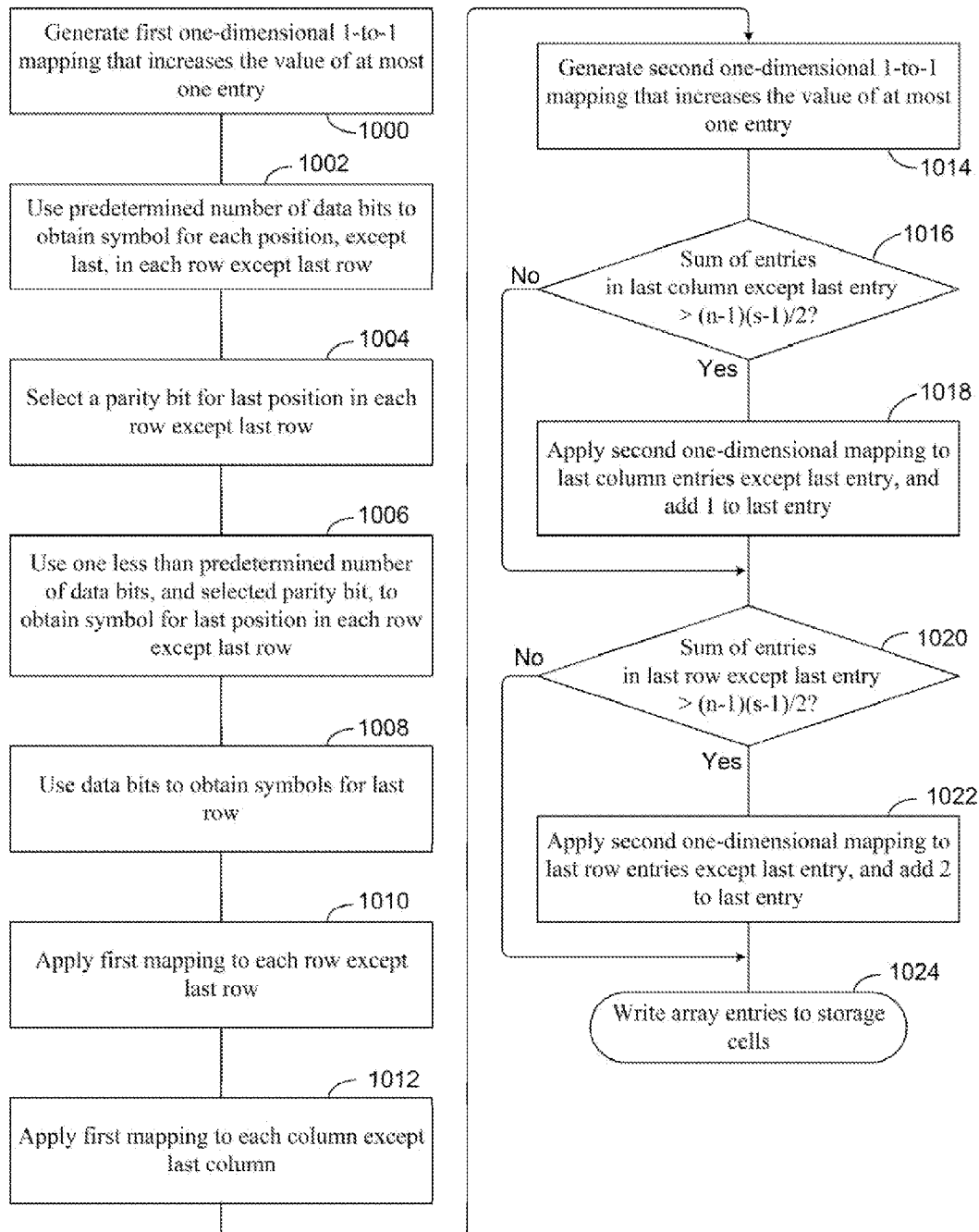
FIG. 10 is a flowchart giving an example of encoding data bits for storage.

FIG. 10 gives another example of storing data bits with minimized half-select currents. In this example it is assumed that the number of rows equals the number of columns (n). A first one-dimensional mapping that increases the value of at most one entry is generated (1000). A predetermined number of data bits is used to obtain symbols for each position, except the last position, in each of the first (n−1) rows (1002). A parity bit is selected for the last position in each row except the last row (1004) so that the parity of each row will have a predetermined value (this value may be even as in a previously-discussed example). A symbol is obtained for the last position in each row (except the last row) by using one less than the predetermined number of data bits and the selected parity bit for that row (1006). Data bits are used to obtain s-ary symbols for the last row (1008). The first mapping is applied to each of the first (n−1) rows (1010), and to each of the first (n−1) columns (1012). A second one-dimensional mapping that increases the value of at most one array entry is generated (1014). If the sum of the entries in the last column, except the last entry, exceeds (n−1)(s−1)/2 (1016), a second one-dimensional mapping is applied to those entries and one is added to the last entry (1018). If the sum of the entries in the last row, except the last entry, exceeds (n−1)(s−1)/2 (1020), a second one-dimensional mapping is applied to those entries and two is added to the last entry (1022). The array entries are written to the storage cells (1024). In some examples the mappings do not increase the value of any array entries.

Figure 11:
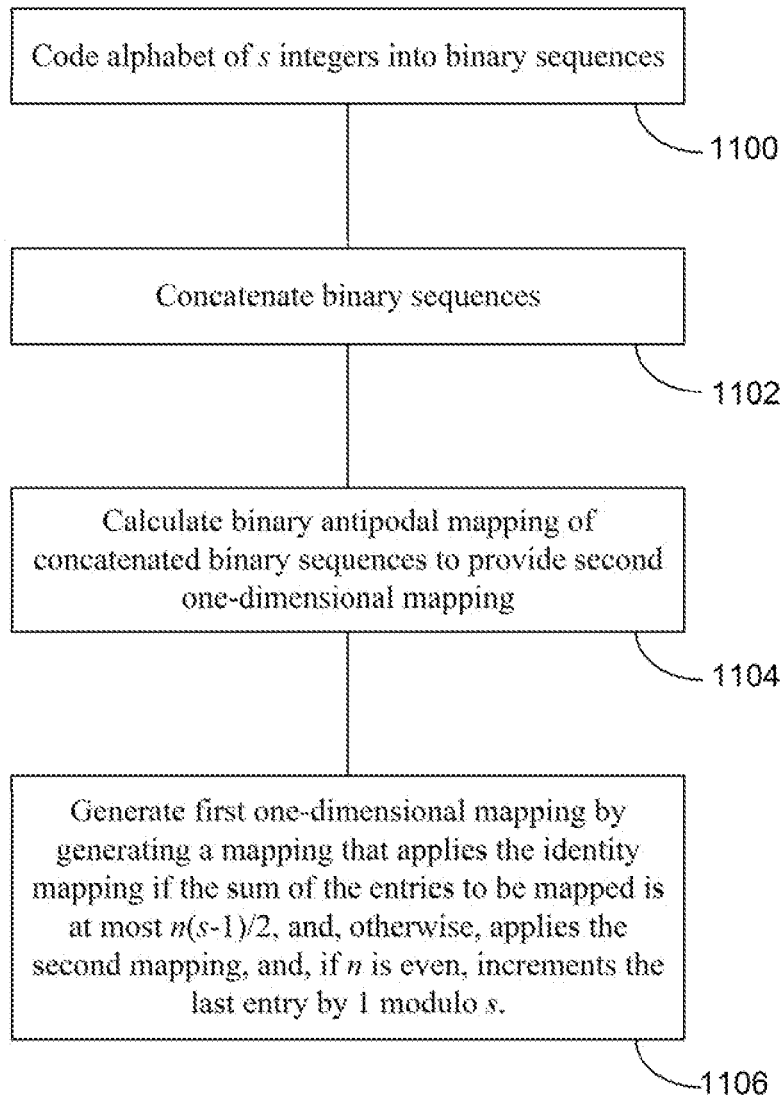
FIG. 11 is a flowchart giving an example of generating first and second mappings.

FIG. 11 gives an example of generating first and second one-dimensional mappings. The second one-dimensional mapping is generated by coding an alphabet of integers corresponding with the states into which the storage cells may be placed into binary sequences (1100), concatenating the binary sequences (1102), and calculating a binary antipodal mapping of the concatenated binary sequences (1104). The first one-dimensional mapping may be generated as a mapping that applies the identity mapping (i.e., leaving the entries unchanged) if the sum of the entries to be mapped is at most n(s−1)/2, and, otherwise applies the second one-dimensional mapping, and, if n is even, increments the last entry by 1, modulo the alphabet size s.

The foregoing examples are illustrative of encoding binary data for storage in multi-state storage cells with minimal degradation of the process due to half-select currents. These encoding and decoding examples are of linear complexity in the number of storage cells, resulting in a fast and efficient way of storing binary data in multi-state storage cells such as memristors and chalcogenide phase change memory (PCM) cells.

We claim:

1. A multi-state memory system with minimized half-select currents, the system comprising:
   a plurality of arrays of row conductors and column conductors; a plurality of storage cells each capable of being placed into any of three or more physical states, each storage cell connected between a different combination of a row conductor and a column conductor; and
   an encoder connected to receive data bits for storage and to apply activation signals m the row conductors and column conductors to write information to the storage cells, the encoder programmed to:
   encode the data bits entries in an array having one row corresponding with each row conductor and one column corresponding with each column conductor;
   apply a predetermined one-dimensional one-to-one mapping that increases the value of at most one entry in the array according to half-select currents of the storage cells to obtain a mapped array; and
   write entries of the mapped array into the storage cells.

2. The system of claim 1 and further comprising a decoder connected to read information from the storage cells and to provide data bits according to the information, the decoder programmed to:
   read entries from the storage cells;
   enter values corresponding with the entries from the storage cells into an array having one row corresponding with each row conductor and one column corresponding with each column conductor to obtain a mapped array;
   apply an inverse of a predetermined one-dimensional mapping to the rows and columns of the array to obtain an un-mapped array;
   decode the entries in the un-mapped array into data bits; and
   provide the data bits as an output.

3. The system of claim 1 wherein the storage cells comprise at least one of memristors and chalcogenide phase change memory cells.

4. The system of claim 1 wherein the one-dimensional one-to-one mapping does not increase the value of any entry in the array.

5. A method of storing data bits to minimize half select currents in a multi-state memory system having a plurality of arrays of row conductors and column conductors and a plurality of storage cells each capable of being placed into any of at least three different states where s is the number of states, the method comprising:
   generating a first one-dimensional one-to-one mapping that increases the value of m most one entry to which the mapping is applied;
   encoding the data bits into entries in an array having m rows and n columns, the array having one row corresponding with each row conductor of the multi-state memory system and one column corresponding with each column conductor of the multi-state memory system;
   applying the mapping to entries in the array according to half-select currents of the cells to obtain a mapped array; and
   writing entries of the mapped array into the storage cells.

6. The method of claim 5 wherein the one-dimensional one-to-one mapping does not increase the value of any entry in the array.

7. The method of claim 5 wherein encoding the data bits into entries in the array comprises:
   forming a first sequence of symbols by selecting from a first alphabet a symbol corresponding with each group of a set of (m−1)(n −1) −1 groups of the data bits;
   arranging the first sequence of symbols into an (m−1)×(n−1) array by placing the first (n−1) symbols into positions in a first row of the array, the next (n−1) symbols into positions in a second row, and so on, excluding a last position in a last row;
   forming a second sequence of symbols by selecting from a second alphabet a symbol corresponding with each group of a set of (m+n−4) groups of the data bits;
   extending the (m−1)×(n−1) array into an (m×n) array by placing the symbols of the second sequence into a first (n−2) positions in a last row of the (m×n) array and into a first (m −2) positions in a last column of the (m×n) array;
   forming a third sequence of symbols by selecting from the first alphabet a symbol corresponding with each group of a set of four groups of the data bits; and
   placing the symbols of the third sequence in any unfilled positions in the (m×n) array.

8. The method of claim 7 wherein the first alphabet comprises a set of s integers and the second alphabet comprises a set of s/2 integers.

9. The method of claim 7 wherein applying the mapping comprises:
  applying the mapping to each row of the first (m−2) rows of the (m×n) array that satisfies a half-select-current row condition to obtain mapped rows;
  adding one to the last entry in any mapped row if that entry is less than (s−1)/2 and subtracting one from the last entry in any mapped row if that entry is more than (s−1)/2;
  applying the mapping to each column of the first (n−2) columns of the (m×n) array that satisfies a half-select-current column condition; and
  adding one to the last entry in any mapped column if that entry is less than (s−1)/2 and subtracting one from the last entry in any mapped column if that entry is more than (s−1)/2.

10. The method of claim 9 wherein applying the mapping further comprising:
  if the row condition is satisfied when applied to the first (n−2) entries of row (m−1), applying the mapping to those entries and adding a predetermined amount to an entry at an intersection of row (m−1) and column (n−1);
  if the column condition is satisfied when applied to the first (m−2) entries of column (n−1), applying the mapping to those entries and adding a predetermined amount to an entry at an intersection of row (m−1) and column n;
  if the column condition is satisfied when applied to the first m−2 entries of column n, applying the mapping to those entries and adding a predetermined amount to an entry at an intersection of row m and column (n−1); and if the row condition is satisfied when applied to the first (n−2) entries of row m, applying the mapping to those entries and adding a predetermined amount to an entry at an intersection of row m and column n.

11. The method of claim 5 wherein the first one-dimensional one-to-one mapping is determined according to the number, of states and a binary antipodal mapping.

12. The method of claim 5 wherein:
  the number of rows in the array is equal to the number of columns;
  encoding the data bits for each of a first (n−1) rows of the array comprises using a predetermined number of the data bits to obtain a symbol from an alphabet of s integers for each position except a last position in the row, selecting a parity bit such that parity of the row will have a predetermined value, and using the selected parity bit plus one less than the predetermined number of data bits to obtain a symbol from that alphabet for the last position in the row;
  encoding the data bits for a last row of the array comprises obtaining s-ary symbols from the input bits according to a preselected parity; and
  applying the first one-dimensional mapping comprises applying the mapping to each of the first (n−1) rows.

13. The method of claim 12 and further comprising:
  generating a second one-dimensional mapping that increases the value of at most one array entry to which the mapping is applied;
  applying the first one-dimensional mapping to each of the first (n−1) columns;
  if a sum of the first (n−1) entries in the last column is greater than (n−1)(s−1)/2, applying a second one-dimensional mapping to those entries and adding one to the last entry; and
  if a sum of the first (n−1) entries in the last row is greater than (n−1)(s−1)/2, applying the second one-dimensional mapping to those entries and adding 2 to the last entry.

14. The method of claim 13 wherein:
  generating the second one-dimensional mapping comprises:
    coding an alphabet of integers corresponding with the states into which the storage cells may be placed into binary sequences,
    concatenating the binary sequences, and
    calculating a binary antipodal mapping of the concatenated binary sequences; and
  generating the first one-dimensional mapping comprises generating a mapping that applies the identity mapping if the sum of the entries to be mapped is at most n(s−1)/2 and, otherwise, applies the second one-dimensional mapping, and, if n is even, increments the value of the last entry by 1 modulo s.

* * * * *

UNITED STATES PATENT AND TRADEMARK OFFICE
CERTIFICATE OF CORRECTION

PATENT NO. : 8,938,575 B2
APPLICATION NO. : 13/438438
DATED : January 20, 2015
INVENTOR(S) : Erik Ordentlich et al.

It is certified that error appears in the above-identified patent and that said Letters Patent is hereby corrected as shown below:

In the Claims

In column 17, line 57, in Claim 1, delete "m" and insert -- to --, therefor.

In column 17, line 60, in Claim 1, delete "bits" and insert -- bits into --, therefor.

In column 18, line 30, in Claim 5, delete "m" and insert -- at --, therefor.

In column 19, line 10, in Claim 9, delete "(s-1)/2and" and insert -- (s-1)/2 and --, therefor.

In column 19, line 40, in Claim 11, delete "number," and insert -- number s --, therefor.

Signed and Sealed this
Twenty-eighth Day of July, 2015

Michelle K. Lee
*Director of the United States Patent and Trademark Office*